United States Patent [19]

D'Anna

[11] Patent Number: 5,001,083
[45] Date of Patent: Mar. 19, 1991

[54] METHOD OF PRIMING SEMICONDUCTOR SUBSTRATE FOR SUBSEQUENT PHOTORESIST MASKING AND ETCHING

[75] Inventor: Pablo E. D'Anna, Los Altos, Calif.

[73] Assignee: Microwave Modules & Devices Inc.

[21] Appl. No.: 217,636

[22] Filed: Jul. 12, 1988

[51] Int. Cl.$^5$ .................. H01L 21/312; H01L 21/47
[52] U.S. Cl. .................... 437/228; 430/313; 430/317; 430/318; 437/225; 437/229; 437/245
[58] Field of Search ............ 437/195, 229, 245, 228, 437/225

[56] References Cited

U.S. PATENT DOCUMENTS

| | | | |
|---|---|---|---|
| 4,184,909 | 1/1980 | Chang | 437/245 |
| 4,448,800 | 5/1984 | Ehara | 437/245 |
| 4,471,004 | 9/1984 | Kim | 437/245 |
| 4,495,220 | 1/1985 | Wolf | 437/229 |
| 4,497,890 | 2/1985 | Helbert | 437/229 |
| 4,523,976 | 6/1985 | Bukhman | 437/229 |
| 4,684,435 | 8/1987 | Kishi | 437/245 |
| 4,740,485 | 4/1988 | Sharpe-Géisler | 437/245 |
| 4,767,723 | 8/1988 | Hinsberg | 437/229 |

OTHER PUBLICATIONS

Ghandhi, "VLSI Fabrication Principles", 1983, pp. 450–451, 542–545.
Wolf et al., "Silicon Processing . . .", 1986, pp. 428–431.
Chang et al., IBM TDB, vol. 22, No. 11, Apr. 1980, pp. 4883–4885.
Bergasse et al., IBM TDB, vol. 15, No. 8, Jan. 1973, pp. 2407–2408.
Bayar et al., IBM TDB, vol. 24, No. 10, Mar. 1982, pp. 5133–5134.

Primary Examiner—Brian E. Hearn
Assistant Examiner—Laura M. Holtzman

[57] ABSTRACT

Disclosed is a method of improving semiconductor device yield by enhancing photoresist adherence to semiconductor substrates during device fabrication. The surface of a layer, such as silicon oxide of silicon nitride, on a semiconductor substrate is coated with a thin layer of oxygen-reactive metal prior to applying photoresist material thereto. The metal is selected from the group consisting of tungsten, titanium, chromium, and combinations thereof; the thickness of the layer of oxygen-reactive metal is of the order of 50–100 Å. The metal coating facilitates the adhesion of the resist material and reduces undercutting of the layer to be etched.

9 Claims, 1 Drawing Sheet

NEGATIVE RESIST
DEVELOPED

POSITIVE RESIST
DEVELOPED

METHOD OF PRIMING SEMICONDUCTOR SUBSTRATE FOR SUBSEQUENT PHOTORESIST MASKING AND ETCHING

BACKGROUND OF THE INVENTION

This invention relates generally to semiconductor devices and methods of making same, and more particularly the invention relates to photoresist masking techniques as used in semiconductor device fabrication.

The fabrication of semiconductor integrated circuits and discrete devices requires the selective introduction of dopants into a monocrystalline semiconductor body and the formation of electrical contacts to selected surface regions of the semiconductor body.

The selective introduction of dopants typically entails ion implantation or atomic diffusion of the dopant through openings in an oxide layer on the surface of the semiconductor body. The openings in the oxide layer are formed by photoresist masking of the oxide layer and chemical (wet or plasma) etching of areas of the oxide layer exposed through the photoresist layer.

Device yield can be greatly affected by a number of factors including the cleanliness of the surface of the semiconductor body, the quality of the photoresist coating of the semiconductor surface, proper exposure of the desired pattern in the photoresist, removal of the unwanted photoresist after exposure by a suitable developer, etching of the exposed semiconductor layer, and finally the removal of the resist material after openings in the oxide layer are formed.

SUMMARY OF THE INVENTION

An object of the invention is a method of fabricating semiconductor devices with improved production yield.

Another object of the invention is a method of priming a surface prior to photoresist coating to enhance the adhesion of the photoresist material and reduce undercutting of the layer under the photoresist.

A feature of the invention is the use of a thin layer of an oxygen-reactive metal or metal combination on the surface of a substrate to increase the adhesion of photoresist material and facilitate subsequent processing.

Briefly, in accordance with one embodiment of the invention, after cleaning the surface of a silicon oxide layer on a semiconductor substrate, prior to processing of the substrate, a thin layer (e.g., 50-100 Å) of a suitable metal or metal combination is formed on the oxide surface. Typically, the substrate comprises a monocrystalline silicon body with a silicon oxide layer on a surface of the body. The metal layer is formed on the surface of the silicon oxide layer.

The metal forms a stable oxide bond to the silicon oxide surface and is easily etched. Suitable metals and metal combinations include tungsten, titanium, chromium, and titanium-tungsten combinations which are easily etched in wet chemicals or plasma gases commonly used in silicon oxide etching and/or silicon processing.

The invention and objects and features thereof will be more readily understood from the following detailed description and appended claims when taken with the drawing.

DETAILED DESCRIPTION OF ILLUSTRATIVE EMBODIMENT

Figure 1:
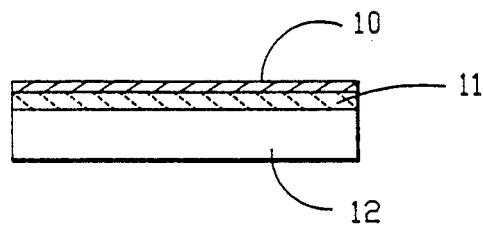
FIGS. 1-5 are section views of a semiconductor substrate illustrating photoresist masking and oxide etching in accordance with the invention.

Before discussing the illustrative embodiments of the invention, conventional steps in fabricating silicon semiconductor devices will be described.

Semiconductor device fabrication steps can be grouped into four general types of processes: (1) starting-material processes, which produce the polished silicon wafer, (2) imaging processes, which replicate the pattern geometries on the various wafer surfaces, (3) deposition and growth processes, wherein various layers of semiconductive materials are applied to the wafer, and (4) etching-masking operations, in which selective removal or addition of the deposited or grown layers is effected. The result of these complex processes is the transformation of a thin-cross-section silicon ingot into many individual devices.

Imaging processes consist of several major steps, generally common to all silicon semiconductor devices, as follows:

Pretreatment—Wafers are chemically and mechanically cleaned to remove dust and other forms of airborne and human contamination. They are then given a short bake to remove residual surface moisture, permitting good resist adhesion. Careful control of wafer pretreatment is essential in maintaining high imaging quality, and this step is critical for this reason. Any defects or contamination allowed at this stage of wafer processing can only be magnified by subsequent processing.

Coating—Spin coating is the most widely used technique for applying photoresist to wafers. The resist is dispensed onto the surfaces of the wafers, which are then accelerated on the coater to provide a thin, uniform film across every wafer surface. The overall objective of this step is to provide a uniform and defect-free layer of a photo- or electron-sensitive masking material.

Softbaking—Softbaking is used to remove the solvents present in the spin-coated film of resist. Infrared, conduction, and microwave heating are used to drive the solvents from the resist coating, rendering it sensitive to exposure energy. Solvents left in the resist film from improper softbaking will cause poor imaging quality, usually from attack by the developer. This is one of the most common types of imaging problems.

Exposure—The goal of exposure is to transmit a latent image of a desired pattern into the resist film. Wafers are either blanket-exposed, step-and-repeat exposed, or scanned by a beam of exposing energy. In all cases, the result is a latent image closely matching the pattern of the photomask. Important parameters controlled are exposure-energy uniformity and exposure time.

Development—The development process is one in which the developer selectively attacks and removes either exposed regions (positive resist) or unexposed regions (negative resist), leaving behind the image to serve as the mask for etching or, in some cases, metallization. The overriding object of development is to remove the resist that does not form the image without adversely affecting the resist that does form the image. In many processes, wafers are given a short plasma "de-scum" in which an oxygen plasma removes a thin layer of the resist image along with any residual films left in the developed areas. Developer concentration, temperature, and time of development must be closely controlled and monitored to ensure repeatable results.

Postbaking—Postbaking is not always used in wafer imaging, especially for processes in which plasma etching is used on a simple undoped oxide. Postbaking is accomplished in the same manner as softbaking, i.e., by some means of heat application. The heat removes any residual moisture from the developing operation and further bonds the resist to the wafer. Extensive postbaking additionally "hardens" the resist by making it chemically inert to the etchant fluid or gas. Major factors to control and monitor in postbaking are bake time and temperature, because these will determine the number of resist-image thermal distortions. Also, minimal time delays are allowed between this operation and etching to avoid resist adherence problems.

Etching—The goal of etching is to precisely remove the layer left exposed by the developing process. For this reason, complete removal of the developed resist is essential, and any residues left may prevent or inhibit etching action. Control parameters in etching are etch time, uniformity, temperature, and concentration of the etch species (liquid or gas).

Removal—The goal of removal is to leave behind a surface completely free of any resist material, since incomplete resist removal may cause defects in doping or metallization processes. Since residual resist films or particles are very hard to detect, relatively aggressive removal techniques are used, usually including corrosive resist strippers.

As can be seen from the above description the conventional but complex process of image transfer of device geometries onto an oxidized silicon wafer surface requires careful control of all the processing steps. In the case of the oxide surface pretreatment process, aside from lack of surface cleanliness, a hydrated surface has been shown to reduce resist adhesion with subsequent deleterious results in device yield. Primers such as HMDS (see Collins and Deverse U.S. Pat. No. 3,549,368) react with hydrated oxide surfaces so as to tie up molecular water. The presence of this water on the oxide surfaces allows the wet etchants to penetrate easily between the resist and the oxide surfaces causing considerable distortion (undercutting) of the image to be transferred and possible loss of device yield. In addition, in many instances, due to the reduced adhesion experienced as a result of the photoresist being deposited on heavily hydrated surfaces, the development process removes the photoresist away from the area supposed to be protected.

Most liquid primers in use today are corrosive or toxic (i.e., trichlorophenylsilane, hexamethyldisilazane) and their mode of application greatly affects their effectiveness. Thus there exists a need for providing a method to improve photoresist adherence to oxidized surfaces of silicon wafers to overcome the problems faced by prior-art techniques.

In accordance with one embodiment of the invention, the surface of an oxide-coated semiconductor substrate is first covered with an adhesion promoter to facilitate the adherence of photoresist to the oxide surface. Referring to the drawings, in FIG. 1 an adhesion promoter 10 is placed on the surface of an oxide layer 11 formed on substrate 12. The layer 10 is approximately 50–100 Å in thickness of an oxygen-reactive metal or metal combination such as tungsten, titanium, chromium and titanium-tungsten. The layer is deposited by vacuum deposition or sputtering with the combination of vacuum processing and the metal surface increasing the adhesion properties of photoresist for silicon oxide processing.

Figure 2:
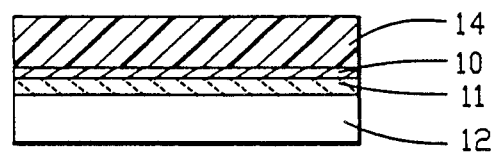

In one embodiment, a combination of 10% titanium and 90% tungsten was deposited by a sputtering process on a clean, dry silicon oxide surface. After the film deposition, subsequent photoresist spin-coating either with negative or positive resist was performed as illustrated in FIG. 2 with the resist 14 overlying the metal layer 10 on oxide 11. Thereafter, the photoresist was softbaked at 100° C. in a convection oven with air as the ambient gas for thirty minutes.

Figure 3:
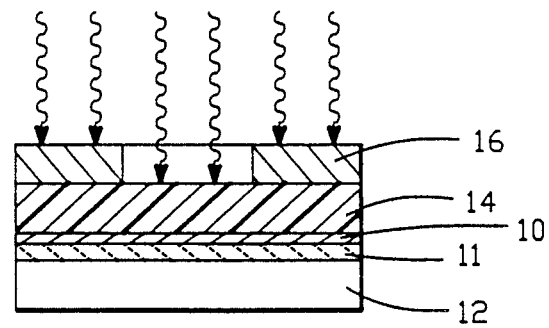
Figure 4:
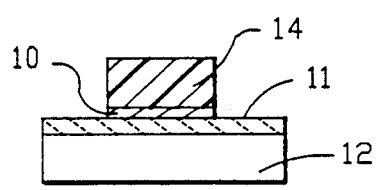
Figure 5:
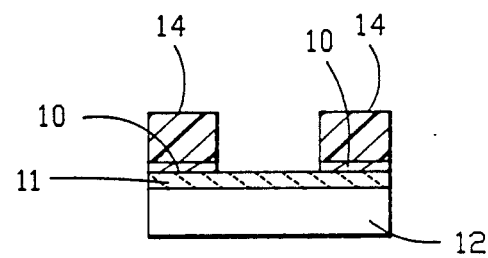

As illustrated in FIG. 3, the next process performed is exposure of the desired image into resist 14 with a contact alignment system through a mask 16. Development of the latent image in the appropriate chemical for a negative or a positive resist is performed subsequently. A developed negative resist protects the oxide underlying the exposed photoresist as shown in FIG. 4, whereas a positive resist protects the oxide under the unexposed portions of the photoresist as shown in FIG. 5. Following development, postbaking is performed in a convection oven with air as the drying medium at 140° C. for thirty minutes, followed by etching of the silicon oxide such as by etching in a plasma R.I.E. system at room temperature with $C_2F_6$ gas at a power density of 4 watts/inch$^2$ for sufficient time to remove the thickness of silicon oxide.

Following the etching of the silicon oxide surface, the removal of the photoresist is accomplished by a plasma $O_2$ method and the removal of the titanium-tungsten alloy is accomplished either by a wet process (hydrogen peroxide 30% solution) or by plasma $C_2F_6$ for about 30 seconds. Tungsten metal is removed in a similar manner. Chrome removal requires immersion in a chrome-etch solution (typically a mix of 90% ceric sulfate with 10% nitric acid). Titanium removal is accomplished by immersion in hot hydrochloric acid, for example. Use of an oxygen-reactive metal in accordance with the invention acts as a sealant against moisture over the silicon oxide surface and provides good adherence for the photoresist. Moreover, moisture from the oxide surface is readily removed during the vacuum deposition process.

While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. In photoresist masking of a semiconductor substrate for device fabrication, the method of
   cleaning a surface of said semiconductor substrate,
   forming a thin layer of oxygen-reactive metal on said surface,
   coating said layer of oxygen-reactive metal with a photoresist material, said oxygen-reactive metal layer providing an adhesive layer for said photoresist layer,
   selectively removing portions of said photoresist material thereby exposing selected areas of said oxygen-reactive metal, etching said selected areas of said oxygen-reactive metal and the underlying surface areas of said semiconductor substrate,
removing said photoresist material, and
removing said oxygen-reactive metal.

2. A method as defined by claim 1 wherein said surface of said semiconductor substrate comprises silicon oxide.

3. A method as defined by claim 1 wherein said surface of said semiconductor substrate comprises silicon nitride.

4. The method as defined by claim 2 wherein said metal is selected from the group consisting of tungsten, titanium, chromium, and combinations thereof.

5. The method as defined by claim 4 wherein said metal is formed by sputtering.

6. The method as defined by claim 4 wherein said metal is formed by vacuum deposition.

7. The method as defined by claim 4 wherein said layer of oxygen-reactive metal has a thickness on the order of 50–100 Å.

8. The method as defined by claim 4 and further including the step of baking said photoresist.

9. The method as defined by claim 8 and further including the step of exposing said photoresist after baking by applying a beam of exposing energy thereto and developing an image in said photoresist.

* * * * *